United States Patent
Teh et al.

(10) Patent No.: US 7,999,325 B2
(45) Date of Patent: Aug. 16, 2011

(54) METHOD TO REMOVE SPACER AFTER SALICIDATION TO ENHANCE CONTACT ETCH STOP LINER STRESS ON MOS

(75) Inventors: Young Way Teh, Singapore (SG); Yong Meng Lee, Singapore (SG); Chung Woh Lai, Singapore (SG); Wenhe Lin, Singapore (SG); Khee Yong Lim, Singapore (SG); Wee Leng Tan, Singapore (SG); John Sudijono, Singapore (SG); Hui Peng Koh, Singapore (SG); Liang Choo Hsia, Singapore (SG)

(73) Assignee: Globalfoundries Singapore Pte. Ltd., Singapore (SG)

(*) Notice: Subject to any disclaimer, the term of this patent is extended or adjusted under 35 U.S.C. 154(b) by 39 days.

(21) Appl. No.: 12/241,073

(22) Filed: Sep. 30, 2008

(65) Prior Publication Data

US 2009/0026549 A1    Jan. 29, 2009

Related U.S. Application Data

(62) Division of application No. 11/122,666, filed on May 4, 2005, now Pat. No. 7,445,978.

(51) Int. Cl.
*H01L 21/00* (2006.01)
(52) U.S. Cl. .................. 257/369; 257/635; 257/338
(58) Field of Classification Search .................. 257/369, 257/635, 338
See application file for complete search history.

(56) References Cited

U.S. PATENT DOCUMENTS

| | | | |
|---|---|---|---|
| 7,053,400 B2 * | 5/2006 | Sun et al. | 257/19 |
| 7,105,394 B2 * | 9/2006 | Hachimine et al. | 438/197 |
| 7,256,084 B2 * | 8/2007 | Lim et al. | 438/199 |
| 7,279,746 B2 * | 10/2007 | Doris et al. | 257/338 |
| 7,445,978 B2 * | 11/2008 | Teh et al. | 438/199 |
| 7,635,620 B2 * | 12/2009 | Chen et al. | 438/199 |
| 7,642,147 B1 * | 1/2010 | Kanakasabapathy | 438/199 |
| 7,776,695 B2 * | 8/2010 | Arnold et al. | 438/275 |
| 7,821,074 B2 * | 10/2010 | Yokoyama | 257/369 |
| 2004/0262784 A1 * | 12/2004 | Doris et al. | 257/900 |
| 2006/0249794 A1 * | 11/2006 | Teh et al. | 257/369 |
| 2006/0252194 A1 * | 11/2006 | Lim et al. | 438/199 |
| 2007/0152277 A1 * | 7/2007 | Shima | 257/369 |
| 2009/0026549 A1 * | 1/2009 | Teh et al. | 257/369 |
| 2009/0108367 A1 * | 4/2009 | Yokoyama | 257/369 |
| 2009/0170254 A1 * | 7/2009 | Rhee et al. | 438/199 |
| 2009/0194816 A1 * | 8/2009 | Onoda | 257/369 |
| 2010/0090289 A1 * | 4/2010 | Yang et al. | 257/369 |
| 2010/0197092 A1 * | 8/2010 | Kim et al. | 438/229 |

* cited by examiner

*Primary Examiner* — Laura M Menz
(74) *Attorney, Agent, or Firm* — Horizon IP Pte. Ltd.

(57) ABSTRACT

An example process to remove spacers from the gate of a NMOS transistor. A stress creating layer is formed over the NMOS and PMOS transistors and the substrate. In an embodiment, the spacers on gate are removed so that stress layer is closer to the channel of the device. The stress creating layer is preferably a tensile nitride layer. The stress creating layer is preferably a contact etch stop liner layer. In an embodiment, the gates, source and drain region have a silicide layer thereover before the stress creating layer is formed. The embodiment improves the performance of the NMOS transistors.

20 Claims, 4 Drawing Sheets

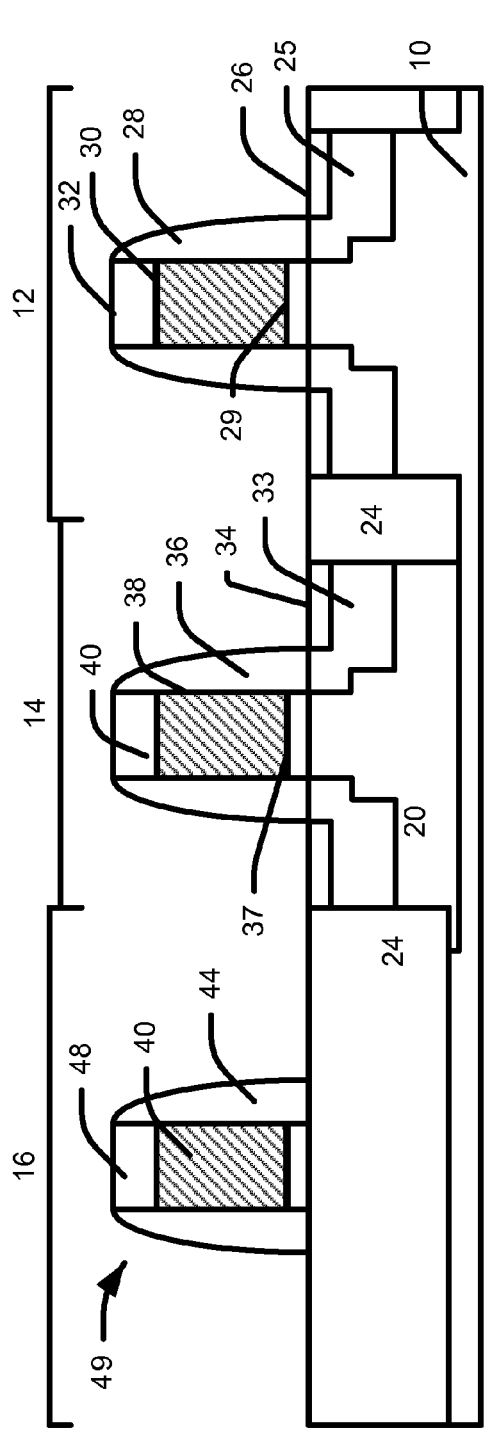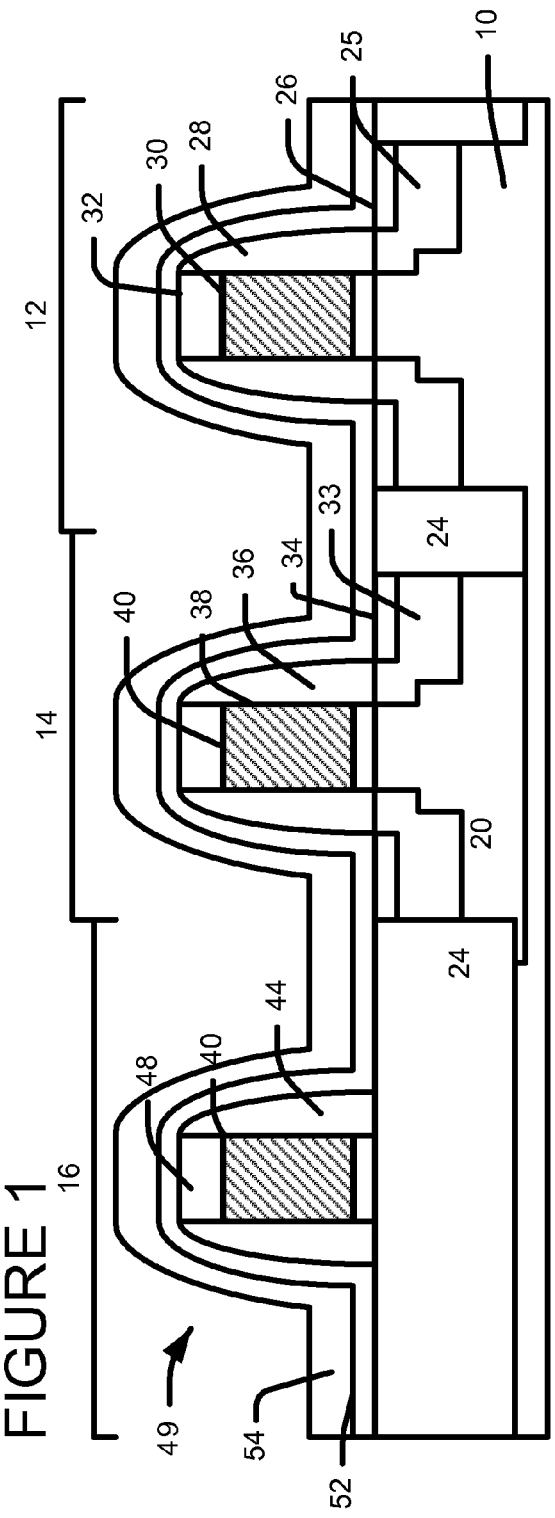

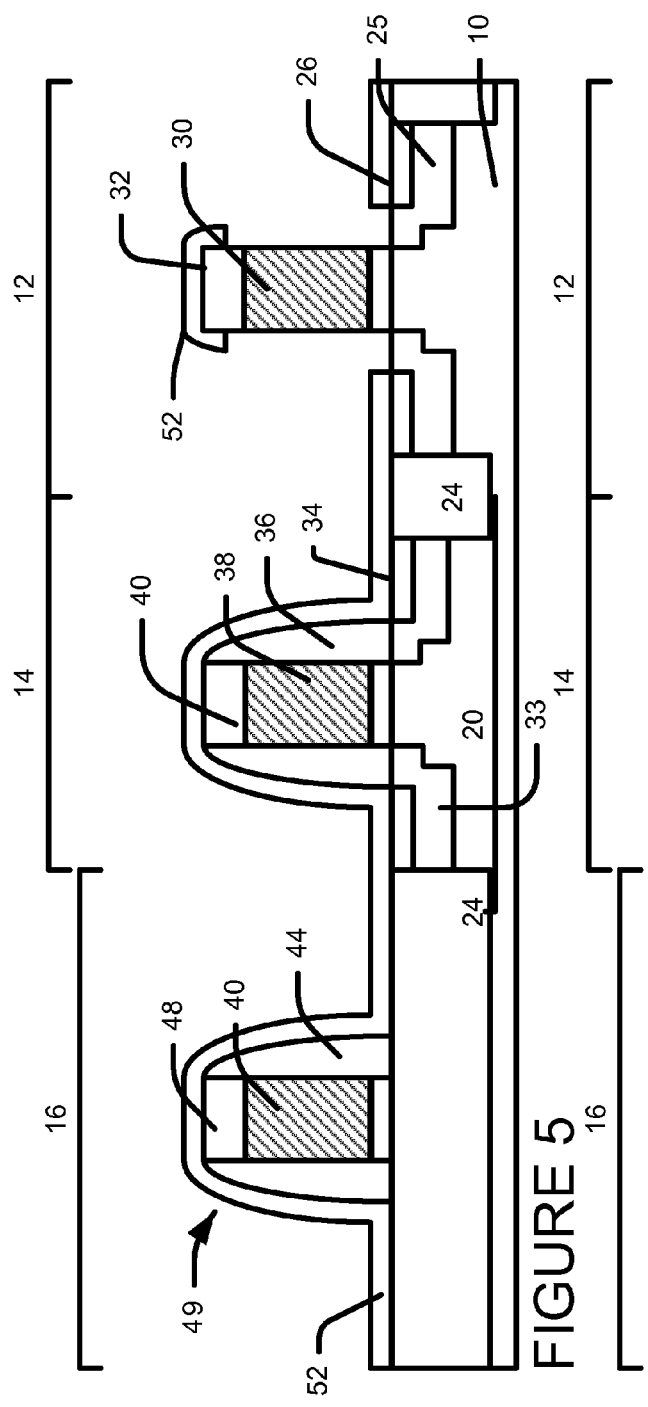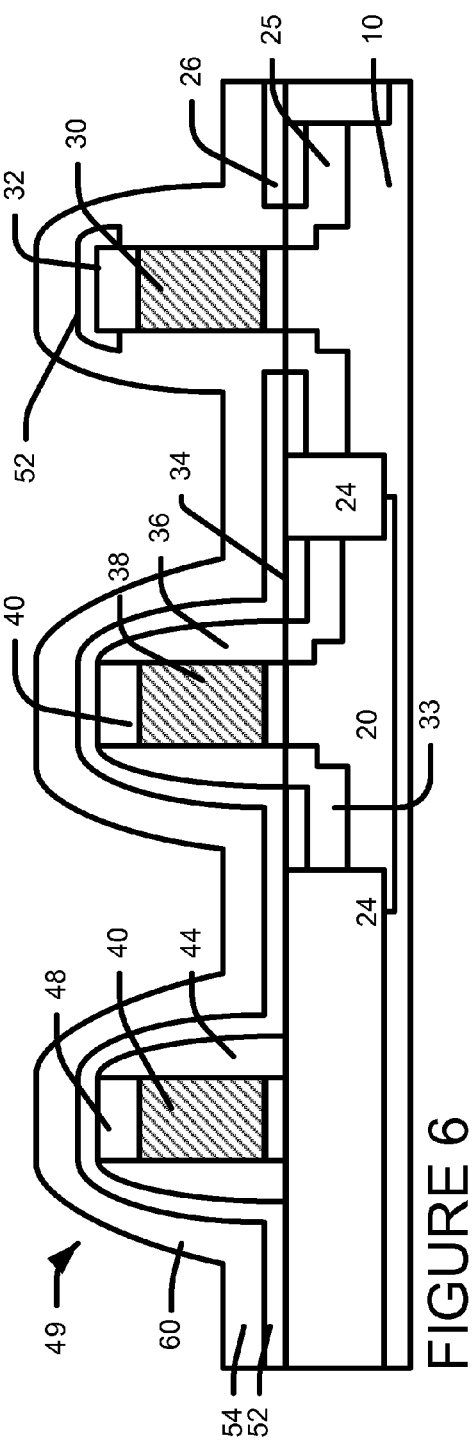
FIGURE 5
FIGURE 6

METHOD TO REMOVE SPACER AFTER SALICIDATION TO ENHANCE CONTACT ETCH STOP LINER STRESS ON MOS

CROSS REFERENCE TO RELATED APPLICATION

This application is a Divisional application which claims benefit of co-pending U.S. patent application Ser. No. 11/122,666, filed May 4, 2005, which is hereby incorporated by reference in its entirety.

BACKGROUND OF THE INVENTION

1) Field of the Invention

This invention relates generally to structures and method for fabricating semiconductor devices and more particularly structures and method for inducing stresses of different areas of a substrate.

2) Description of the Prior Art

As semiconductor device switching speeds continue to increase and operating voltage levels continue to decrease, the performance of MOS and other types of transistors needs to be correspondingly improved. The carrier mobility in a MOS transistor has a significant impact on power consumption and switching performance, where improvement in carrier mobility allows faster switching speeds. The carrier mobility is a measure of the average speed of a carrier (e.g., holes or electrons) in a given semiconductor, given by the average drift velocity of the carrier per unit electric field. Improving carrier mobility can improve the switching speed of a MOS transistor, as well as allow operation at lower voltages.

One way of improving carrier mobility involves reducing the channel length and gate dielectric thickness in order to improve current drive and switching performance. However, this approach may increase gate tunneling current, which in turn degrades the performance of the device by increasing off state leakage. In addition, decreasing gate length generally calls for more complicated and costly lithography processing methods and systems.

The importance of overcoming the various deficiencies is evidenced by the extensive technological development directed to the subject, as documented by the relevant patent and technical literature. The closest and apparently more relevant technical developments in the patent literature can be gleaned by considering the following.

US 20040262784 High performance CMOS device structures and method of manufacture—A semiconductor device structure includes at least two field effect transistors formed on same substrate, the first field effect transistor includes a spacer having a first width, the second field effect transistor includes a compressive spacer having a second width, the first width being different than said second width. Preferably, the first width is narrower than the second width. A tensile stress dielectric film forms a barrier etch stop layer over the transistors. Inventors: Bruce B. Doris, et al.

U.S. Pat. No. 6,825,529: and US 20040113217A1: Stress inducing spacers—Spacer structure for semiconductor devices formed in substrate, has two spacer structures, each comprising stress inducing material adjacent to both sidewall of one of device's gate terminal and its channel which applies mechanical stress—Inventor: Chidambarrao US 20040104405A1: Novel CMOS device—Improving mobility of holes and electrons within semiconductor device structure, involves forming first and second stress layers over p- and n-type metal oxide semiconductor device respectively—Inventor: Huang U.S. Pat. No. 6,573,172: Methods for improving carrier mobility of PMOS and NMOS devices—Fabrication of semiconductor device by forming P-channel and N-channel metal oxide semiconductor transistors in wafer, forming tensile film on P-channel transistor and forming compressive film on N-channel transistor—Inventor: En, et al.

US20030040158A1: Semiconductor device and method of fabricating the same—Semiconductor device includes first nitride layer containing tensile stress and second nitride layer containing compressive stress—Inventor: Saitoh, Takehiro Thus, there remains a need for methods by which the carrier mobility of both NMOS and PMOS transistors may be improved so as to facilitate improved switching speed and low-power, low-voltage operation of CMOS devices, without significantly adding to the cost or complexity of the manufacturing process.

SUMMARY OF THE INVENTION

The embodiments of the present invention provides a structure and a method of manufacturing a FET device without spacer and with an overlying stress layer improves device performance which is characterized as follows.

An example embodiment of the invention is a method of fabrication semiconductor device; comprising the steps of:
  providing a substrate having a first region and a second region;
  providing a first gate, first source/drain regions in said first region; a first channel region in said first region under said first gate; providing a second gate, second spacers on the second gate sidewalls; second source/drain regions in said second region adjacent to said second spacers;
  forming a stress dielectric layer over: the first gate, the first source/drain regions, the second gate, the second spacers and the second source/drain regions; whereby said stress dielectric layer serves to puts stress on the first channel region on the substrate close to the first gate.

Another example embodiment of the invention is a method of fabrication semiconductor device; comprising the steps of:
  providing a substrate having a first region and a second region;
  providing a first gate, first spacers on the first gate sidewalls; first source/drain regions in the first region adjacent to the first spacers; providing first S/D silicide regions over the first source/drain regions;
  providing a second gate, second spacers on the second gate sidewalls; second source/drain regions in the second region adjacent to the second spacers; providing second S/D silicide regions over the second source/drain regions;
  forming a conformal dielectric layer over the substrate at least the first region and the second region;
  forming a non-conformal dielectric layer over the conformal dielectric layer; the non-conformal dielectric layer is thicker over the second cap and first cap and the substrate than over the second and first spacer sidewalls;
  removing a first thickness of the non-conformal dielectric layer in the first region; using an etch, to expose the conformal dielectric layer over the first spacers;
  removing the first spacers using an etch;
  removing the non-conformal dielectric layer;
  forming a stress dielectric layer which serves to puts stress on the stress on the substrate close to the first gate where the first spacers were removed in the first region thereby enhance the first device performance.

An aspect of this embodiment is wherein the first region is a NFET region and the second region is a PFET region; and the stress dielectric layer produces a compressive stress on the NFET channel in a uni-axial direction; and the channel has a 110 crystal orientation.

An example embodiment of the invention is a semiconductor device comprises:
  a substrate having a first region and a second region;
  a first gate, first source/drain regions in the first region adjacent to the first spacers; providing first S/D suicide regions over the first source/drain regions;
  a second gate over the second region, second spacers on the second gate sidewalls; second source/drain regions in the second region adjacent to the second spacers; second S/D suicide regions over the second source/drain regions;
  a conformal dielectric layer over the second gate and the second spacers, the second S/D silicide regions, and the first S/D silicide regions;
  a stress dielectric layer over the sidewalls of the first gate and over the substrate adjacent to the first gate; the stress dielectric layer which serves to puts stress on the stress on the substrate close to the first gate which does not have first spacers thereby enhance the first device performance;
  the stress dielectric layer over the sidewalls of the second spacers and the second gate.

An aspect of this embodiment is wherein the first region is a NFET region and the second region is a PFET region; the stress dielectric layer is a tensile stress layer; and the stress dielectric layer produces a compressive stress on the NFET channel in a uni-axial direction; and the NFET channel has a 110 crystal orientation.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 6 are cross sectional views for illustrating a method for manufacturing a transistor according to a first example embodiment of the present invention.

DETAILED DESCRIPTION OF THE EXAMPLE EMBODIMENTS

First Example Embodiment

Figure 3:
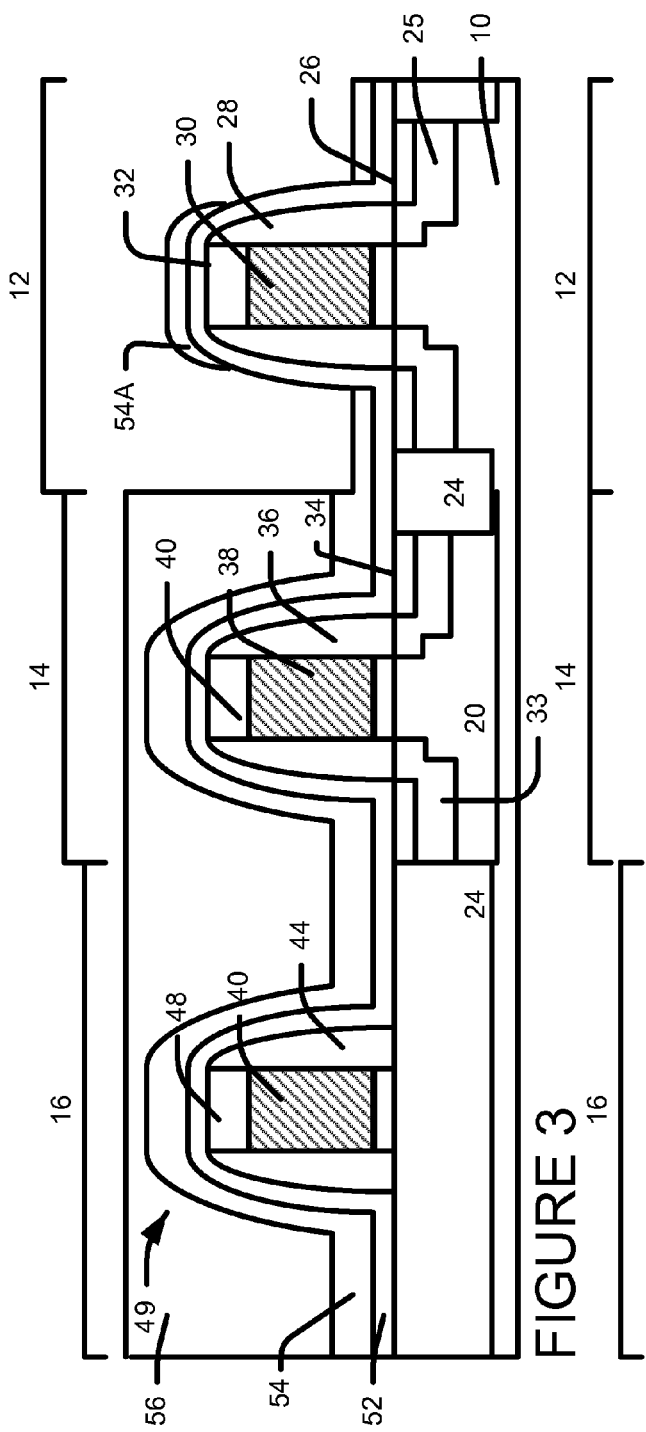

The example embodiments of the present invention will be described in detail with reference to the accompanying drawings. The example embodiments provide methods of applying a stress on a channel of an MOS transistor using a stress layer in silicide process. Preferably, the source drain regions have a silicide contact layer thereover. An embodiment removes spacers from a gate and forms a stress layer on or adjacent to the gate. The spacers can be removed from either the PMOS or the NMOS transistor.

A. Substrate has a NFET Region and a PFET Region

As shown in FIG. 1, we provide a substrate having a NFET region 12, a PFET region 14 and an optional peripheral region 16. The substrate can have isolation region(s) 24 at least between the NFET region 12, the PFET region 14 and the peripheral region 16.

In the NFET region, we provide a NFET transistor that can be comprised of NFET gate dielectric 29, a NFET gate 30, NFET cap 32, a NFET spacers 28 on the NFET gate 30 sidewalls; NFET source/drain regions 25 in the NFET region adjacent to the NFET spacers 28. We provide NFET S/D silicide regions 26 over the NFET source/drain regions 25 and the NFET cap 32 preferably comprised of silicide. The NFET transistor has a NFET channel under the NFET gate. A NFET channel is in the NFET region under the NFET gate.

In the PFET region 14, we provide a PFET transistor that can be comprised of a PFET gate dielectric layer 37, a PFET gate 38, PFET cap 40, PFET spacers 36 on the PFET gate 38 sidewalls. We provide PFET source/drain regions 33 in the PFET region 14 adjacent to the PFET spacers 36. PFET S/D suicide regions 34 are formed over the PFET source/drain regions 33. The PFET cap 40 is preferably comprised of a silicide. A PFET channel is in the PFET region under the PFET gate.

In the peripheral region, we provide peripheral gate structure 49 over the peripheral region 16. The peripheral gate structures are comprised of a peripheral gate 40, peripheral spacer 44 and peripheral cap 48.

The substrate has an (peripheral) isolation region 24 over at least a portion of the peripheral region 16; and the peripheral gate structure 49 can be over the isolation region.

The structures can be made using a salicide process.

B. Conformal Dielectric Layer

Referring to FIG. 2, we form a conformal dielectric layer 52 (about or substantially uniform thickness) over the substrate at least the NFET region 12, the PFET region 14 and the peripheral region 16. The conformal dielectric layer preferably has about uniform thickness.

The conformal dielectric layer 52 can be comprised of oxide or silicon oxynitride (SiON) and can have a thickness between 50 and 100 angstroms.

C. Non-Conformal Dielectric Layer

We then form a non-conformal dielectric layer 54 over the conformal dielectric layer 52. The non-conformal dielectric layer can be comprised of nitride or SiC. A nitride non-conformal dielectric layer can be formed using a PECVD process.

The non-conformal dielectric layer 54 is thicker over about horizontal surfaces than over sloped or vertical surfaces. The non-conformal dielectric layer 54 can be between 150% and 400% thicker over about horizontal surfaces than over sloped or vertical surfaces. The tops of the gates and the substrate are about horizontal. The spacer sidewalls are sloped.

The non-conformal layer 54 is thicker over the PFET cap 40 and NFET cap 32 and the substrate than over the PFET and NFET spacer 36 28 sidewalls.

For example, the non-conformal layer 54 can have a thickness between 300 and 400 angstroms over the PFET cap 40 and NFET cap 32 and the substrate; and a thickness between 100 and 200 angstroms over the PFET and NFET spacer 36 28 sidewalls.

D. Remove a First Thickness of the Non-Conformal Nitride Layer in the NFET Region As shown in FIG. 3, we remove a first thickness (portion) of the non-conformal nitride layer 54 in the NFET region 12 to expose at least a portion of the conformal dielectric layer 52 over the NMOS spacers 28.

A photoresist layer 56 can be formed over the non-NMOS regions (e.g. PMOS region 14 and peripheral region 16).

The etch can be an isotropic etch such as a wet etch or Chemical Down Stream Etch (CDE).

The first thickness is between about 33 and 66% of the maximum thickness of the non-conformal nitride layer 54.

Due to the poor step coverage of the non-conformal layer over the spacers, the non-conformal layer is etched away before the non-conformal layer over the horizontal surfaces (e.g., cap, silicide regions 26, isolation regions 24, etc.).

Next, we remove the NMOS spacers 28.

Figure 4:
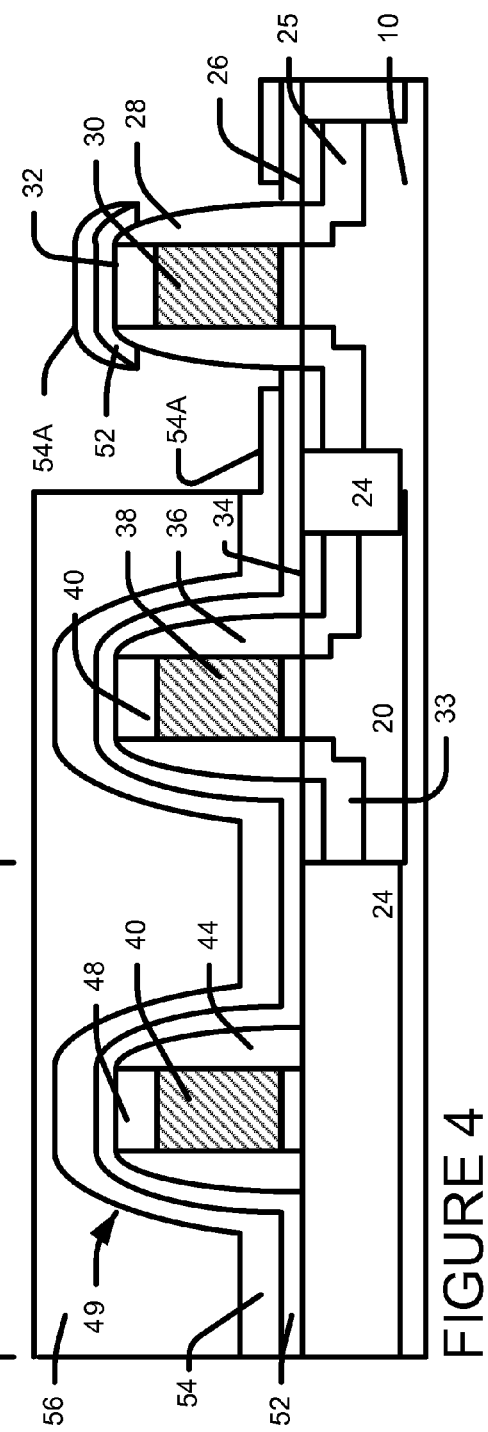

An example option is shown in FIGS. 4 and 5.

E. Remove the Conformal Dielectric Layer Over the NMOS Spacers

FIG. 4 shows the PFET mask 56 over the PFET region 14 and the peripheral region 16. We remove the exposed conformal dielectric layer 52 over the NMOS spacers 28 to expose the NMOS spacers 28. The conformal dielectric layer 52 can be removed using an isotropic etch.

F. Remove the NMOS Spacers

As shown in FIG. 5, we etch the NMOS spacers 28. The etch can be an isotropic etch that is selective to the spacer material. The etch preferably exposed the substrate surface immediately adjacent to the gate 30.

Then we remove the mask 56.

G. Remove the Non-Conformal Nitride Layer

As shown in FIG. 5, we remove the non-conformal layer 54. The non-conformal nitride layer 54 can be removed using an etch selective to oxide.

The silicide regions 26 34 are protected by the conformal dielectric layer 52 during this nitride etch.

H. Form a Tensile Dielectric Layer

As shown in FIG. 6, we form a tensile dielectric layer 60 (e.g., tensile stress nitride) which serves to put a compressive stress on the substrate close to the gate (where the spacers 28 used to be) in the NMOS region 12, which in turn cause a tensile strain in the NMOS channel region (Si below Poly 30), thereby enhance the NMOS transistor performance. The tensile dielectric layer can serve as a contact etch stop liner (ESL).

The PMOS transistor device is affected less than the NMOS device because the PMOS spacers 36 separate and space the tensile nitride layer 60 from the substrate under the PMOS spacers 36 and the PMOS channel region.

The tensile dielectric (e.g., nitride) layer causes a tensile stress in a channel region of the NMOS transistor.

The stress is preferably in a Uni-axial direction only. A preferred channel has a 110 crystal orientation. Uni-axial strain means the strain is in X and Y directions, not in the Z direction.

A feature of the embodiment is that because the spacers are removed, the stressor is nearer to the channel thus enhancing the strain effect.

The device can be finished using conventional process such as forming a ILD layer, contacts, and subsequent levels of IMD and interconnects.

Alternate Embodiment

Figure 7:
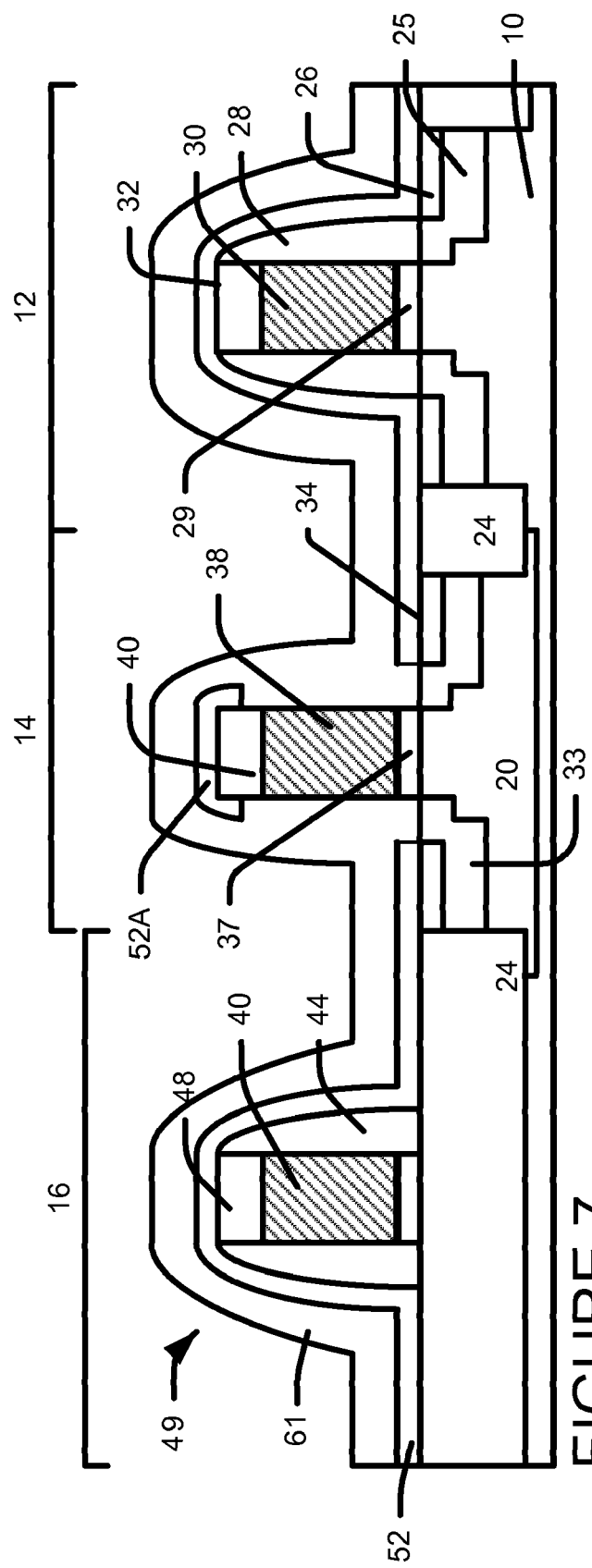
FIG. 7 is cross sectional view for illustrating a method for manufacturing a transistor according to a second example embodiment of the present invention.

FIG. 7 shows an alternate embodiment where the spacers 36 on the PMOS gate device 38 40 are removed. The process for this embodiment can be similar to the first embodiment by masking the non-PMOS regions and removing the PMOS spacers 36. Stress layer 61 is formed over the substrate surface. For this PMOS embodiment, the stress layer 61 is a compressive film.

The stress layer 61 preferably puts a tensile stress on the substrate near the PMOS gate, which in turn causes a compressive strain on the PMOS channel (Si below Poly 38). This enhances the PMOS transistor.

A. Non-Limiting Example Embodiments

In the above description, numerous specific details are set forth such as flow rates, pressure settings, thicknesses, etc., in order to provide a more thorough understanding of the present invention. Those skilled in the art will realize that power settings, residence times, gas flow rates are equipment specific and will vary from one brand of equipment to another. It will be obvious, however, to one skilled in the art that the present invention may be practiced without these details. In other instances, well known process have not been described in detail in order to not unnecessarily obscure the present invention.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention Unless explicitly stated otherwise, each numerical value and range should be interpreted as being approximate as if the word about or approximately preceded the value of the value or range.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A device comprising:
   a substrate with first and second active regions;
   a first transistor of a first type disposed in the first active region, wherein the first transistor comprises exposed gate sidewalls;
   a second transistor of a second-type disposed in the second active region, wherein the second transistor comprises sidewall spacers; and
   a stress layer comprising a first stress disposed over both the first and second active regions over the first and second transistors, wherein the first stress of the stress layer affects the second transistor less than the first transistor due to the exposed gate sidewalls of the first transistor.

2. The device of claim 1 wherein:
   the first transistor comprises a first gate with the exposed sidewalls and first diffusion regions adjacent to the first gate; and
   the second transistor comprises a second gate with sidewall spacers and second diffusion regions adjacent to the second gate.

3. The device of claim 1 comprises a liner lining the second region between the stress layer and the second transistor and the first diffusion regions.

4. The device of claim 1 wherein:
   the first stress comprises a tensile stress, the first-type comprises n-type and the second type comprises p-type; or
   the first stress comprises a compressive stress, the first-type comprises p-type and the second type comprises n-type.

5. A device comprising:
   a substrate prepared with first and second active regions;
   a first transistor of a first-type disposed in the first active region, wherein the first transistor comprises exposed gate sidewalls;
   a second transistor of a second-type disposed in the second active region, wherein the second transistor comprises sidewall spacers; and
   a stress layer comprising a first stress disposed over both the first and second active regions over the first and second transistors, wherein the first stress of the stress layer affects the first transistor more than the second transistor due to the exposed gate sidewalls of the first transistor.

6. The device of claim 5 wherein:
   the first stress comprises a tensile stress, the first-type comprises n-type and the second type comprises p-type; or
   the first stress comprises a compressive stress, the first-type comprises p-type and the second type comprises n-type.

7. The device of claim 5 wherein:
   the first transistor comprises a first gate, first source/drain diffusion regions adjacent to the first gate and a first channel below the first gate between the first source/drain diffusion regions; and
   the second transistor comprises a second gate, second source/drain diffusion regions adjacent to the second gate and a second channel below the second gate between the second source/drain diffusion regions.

8. The device of claim 7 wherein:
   the first stress comprises a tensile stress, the first-type comprises n-type and the second type comprises p-type; or
   the first stress comprises a compressive stress, the first-type comprises p-type and the second type comprises n-type.

9. The device of claim 7 wherein the second gate comprises sidewall spacers, the sidewall spacers cause the first stress of the stress layer to affect the second transistor less than the first transistor.

10. The device of claim 9 comprises a liner lining the second region between the stress layer and the second transistor and the first source/drain diffusion regions.

11. The device of claim 5 comprises a liner lining the second region between the stress layer and the second transistor and first source/drain diffusion regions of the first transistor.

12. A device comprising:
    a substrate with first and second active regions;
    first and second transistors disposed in the first and second active regions, wherein the first transistor comprises a first-type with exposed gate sidewalls and the second transistor comprises a second type with sidewall spacers; and
    a stress layer comprising a stress disposed over both the first and second active regions over the first and second transistors, wherein the stress of the stress layer affects the second transistor less than the first transistor due to the exposed gate sidewalls of the first transistor.

13. The device of claim 12 wherein:
    the stress comprises a tensile stress, the first-type comprises n-type and the second type comprises p-type; or
    the stress comprises a compressive stress, the first-type comprises p-type and the second type comprises n-type.

14. The device of claim 13 wherein:
    the first transistor comprises a first gate with the exposed gate sidewalls, first source/drain diffusion regions adjacent to the first gate and a first channel below the first gate between the first source/drain diffusion regions; and
    the second transistor comprises a second gate, second source/drain diffusion regions adjacent to the second gate and a second channel below the second gate between the second source/drain diffusion regions.

15. The device of claim 14 wherein:
    the stress comprises a tensile stress, the first-type comprises n-type and the second type comprises p-type; or
    the stress comprises a compressive stress, the first-type comprises p-type and the second type comprises n-type.

16. The device of claim 14 wherein the first gate comprises exposed sidewalls and the second gate comprises sidewall spacers, the sidewall spacers cause the stress of the stress layer to affect the second transistor less than the first transistor.

17. The device of claim 16 comprises a liner lining the second region between the stress layer and the second transistor and the first source/drain diffusion regions.

18. The device of claim 12 comprises a liner lining the second region between the stress layer and the second transistor and first source/drain diffusion regions of the first transistor.

19. The device of claim 5 comprises an isolation region separating the active regions.

20. The device of claim 12 comprises an isolation region separating the active regions.

* * * * *